(12) United States Patent
Nasiri

(10) Patent No.: US 6,480,320 B2
(45) Date of Patent: Nov. 12, 2002

(54) MICROELECTROMECHANICAL MIRROR AND MIRROR ARRAY

(75) Inventor: Steven S. Nasiri, Saratoga, CA (US)

(73) Assignee: Transparent Optical, Inc., Santa Clara, CA (US)

( * ) Notice: Subject to any disclaimer, the term of this patent is extended or adjusted under 35 U.S.C. 154(b) by 78 days.

(21) Appl. No.: 09/779,189

(22) Filed: Feb. 7, 2001

(65) Prior Publication Data

US 2002/0131679 A1 Sep. 19, 2002

(51) Int. Cl.$^7$ .............................. G02B 26/00; G02B 6/42
(52) U.S. Cl. ........................ 359/291; 359/290; 385/18
(58) Field of Search ................................. 359/290, 291; 385/18

(56) References Cited

U.S. PATENT DOCUMENTS

| | | | |
|---|---|---|---|
| 5,535,047 A | 7/1996 | Hornbeck | 359/295 |
| 5,583,688 A | 12/1996 | Hornbeck | 359/291 |
| 5,648,618 A | 7/1997 | Neukermans et al. | 73/862.08 |
| 5,867,302 A * | 2/1999 | Fleming | 359/291 |
| 5,960,132 A | 9/1999 | Lin | 385/18 |
| 6,028,689 A * | 2/2000 | Michalicek et al. | 359/224 |
| 6,040,935 A | 3/2000 | Michalicek | 359/198 |
| 6,044,705 A | 4/2000 | Neukermans et al. | 73/504.02 |
| 6,198,180 B1 * | 3/2001 | Garcia | 310/36 |
| 6,256,134 B1 | 7/2001 | Dhuler et al. | 359/212 |
| 6,283,601 B1 * | 9/2001 | Hagelin et al. | 359/871 |
| 2001/0048265 A1 * | 12/2001 | Miller et al. | 310/309 |

FOREIGN PATENT DOCUMENTS

| | | |
|---|---|---|
| WO | WO 01/88594 | 11/2001 |
| WO | WO 01/96930 | 12/2001 |

OTHER PUBLICATIONS

Toshiyoshi and Fujita, "Electrostatic Micro Torsion Mirrors for an Optical Switch Matrix," *Journal of Microelectromechanical Systems*, 1996, 5(4):231–237.
PCT/ISA/210 International Search Report for International Application No. PCT/US02/03939 (Jul. 10, 2002).
PCT/ISA/210 International Search Report For International Application No. PCT/US02/03797 (Aug. 1, 2001).

* cited by examiner

Primary Examiner—Georgia Epps
Assistant Examiner—David N. Spector
(74) Attorney, Agent, or Firm—Fish & Richardson P.C.

(57) ABSTRACT

A freely rotatable microelectromechanical mirror and mirror array. Each mirror is connected to a plate flexibly suspended from a plurality of actuators by a plurality of plate flexures. The actuators are flexibly suspended from a support structure by a plurality of actuator flexures. The support structure is held above and electrically isolated from a reference layer by a plurality of standoff posts. The reference layer contains a plurality of actuation means such as control electrodes to move the actuators in first and second directions when actuated. Control voltages can be selectively applied to selective control electrodes to selectively move the actuators, and extend the plurality of plate flexures. The extended plate flexures create a net restoring force or torque to translate or rotate the freely movable plate. The plate and attached mirror are thereby translated or rotated about an arbitrary axis of rotation without stress.

76 Claims, 10 Drawing Sheets

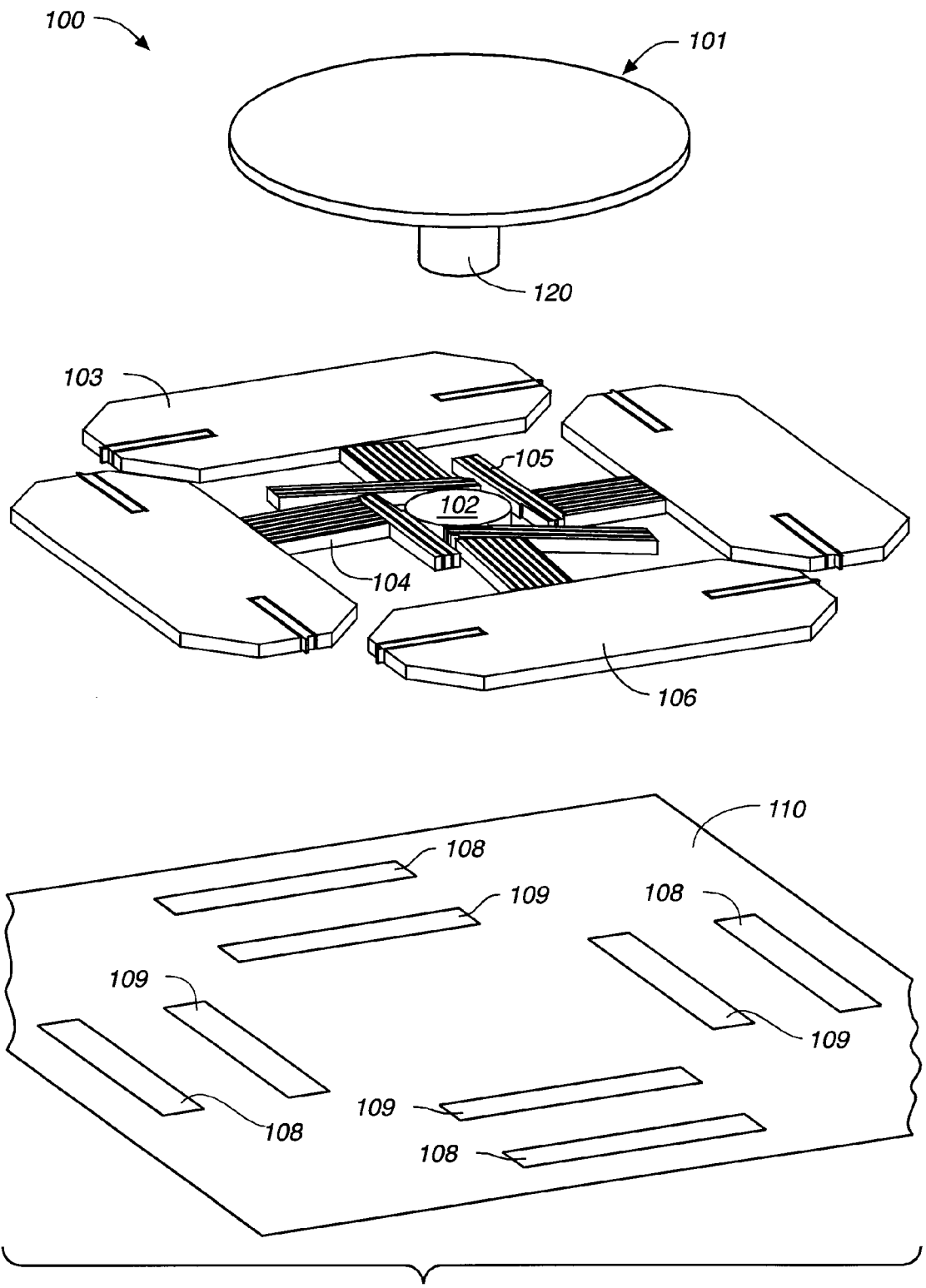
FIG._1

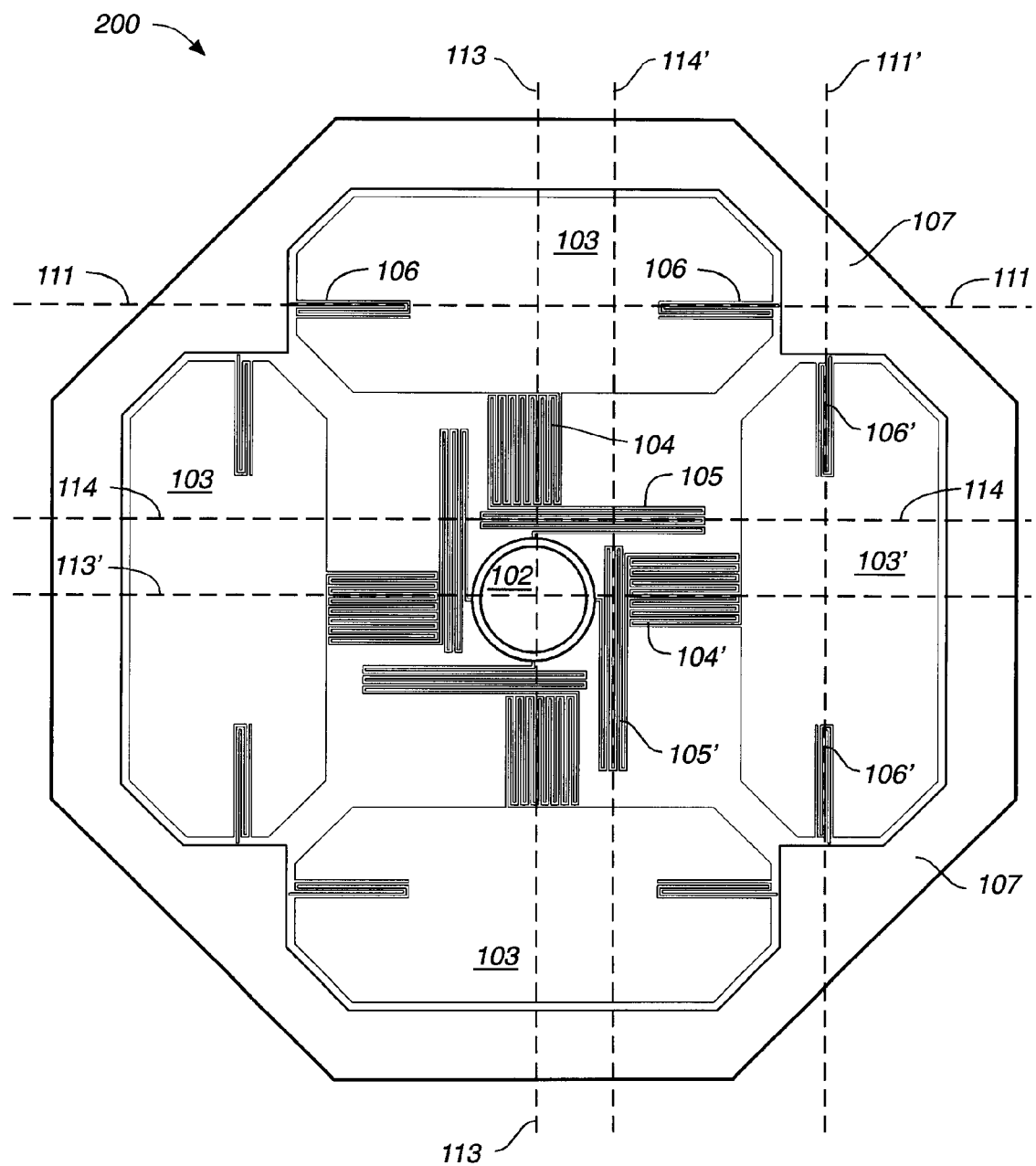
FIG._2

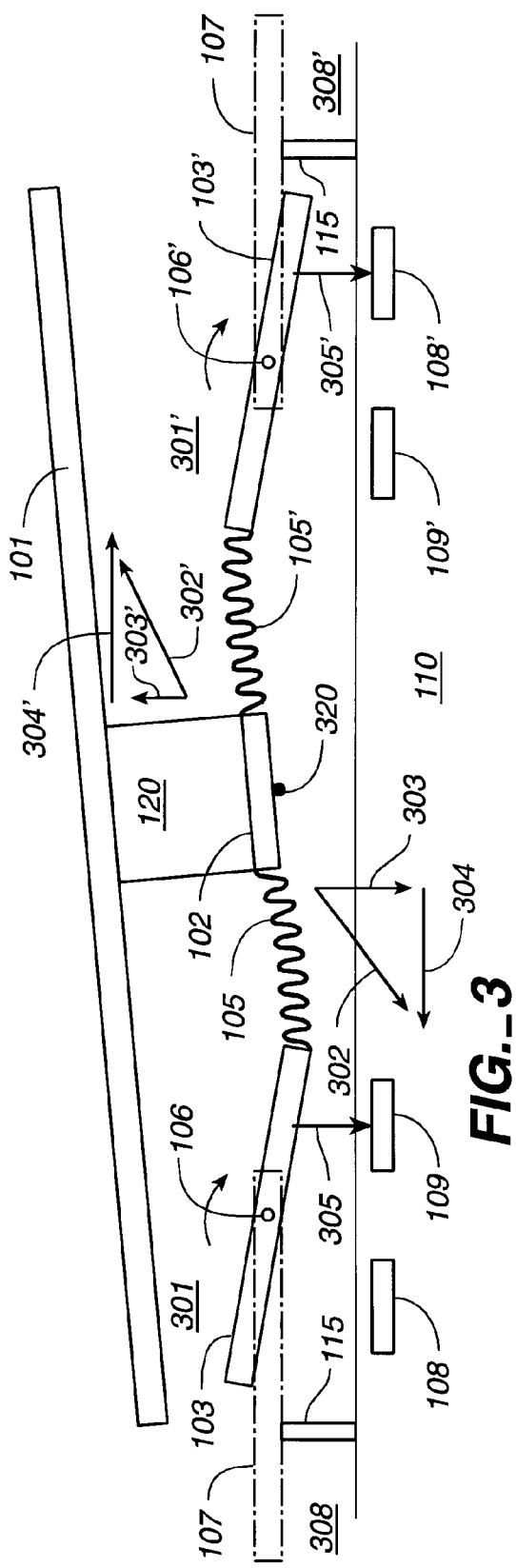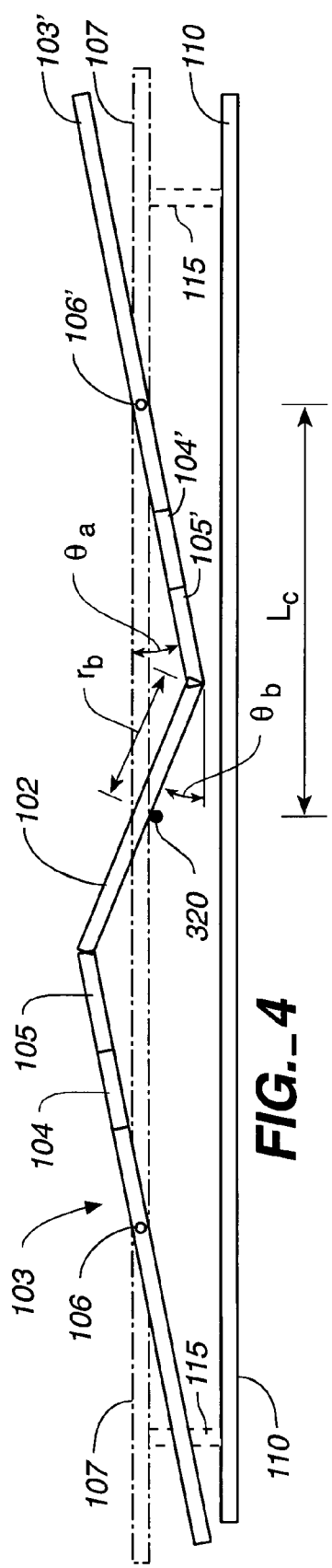

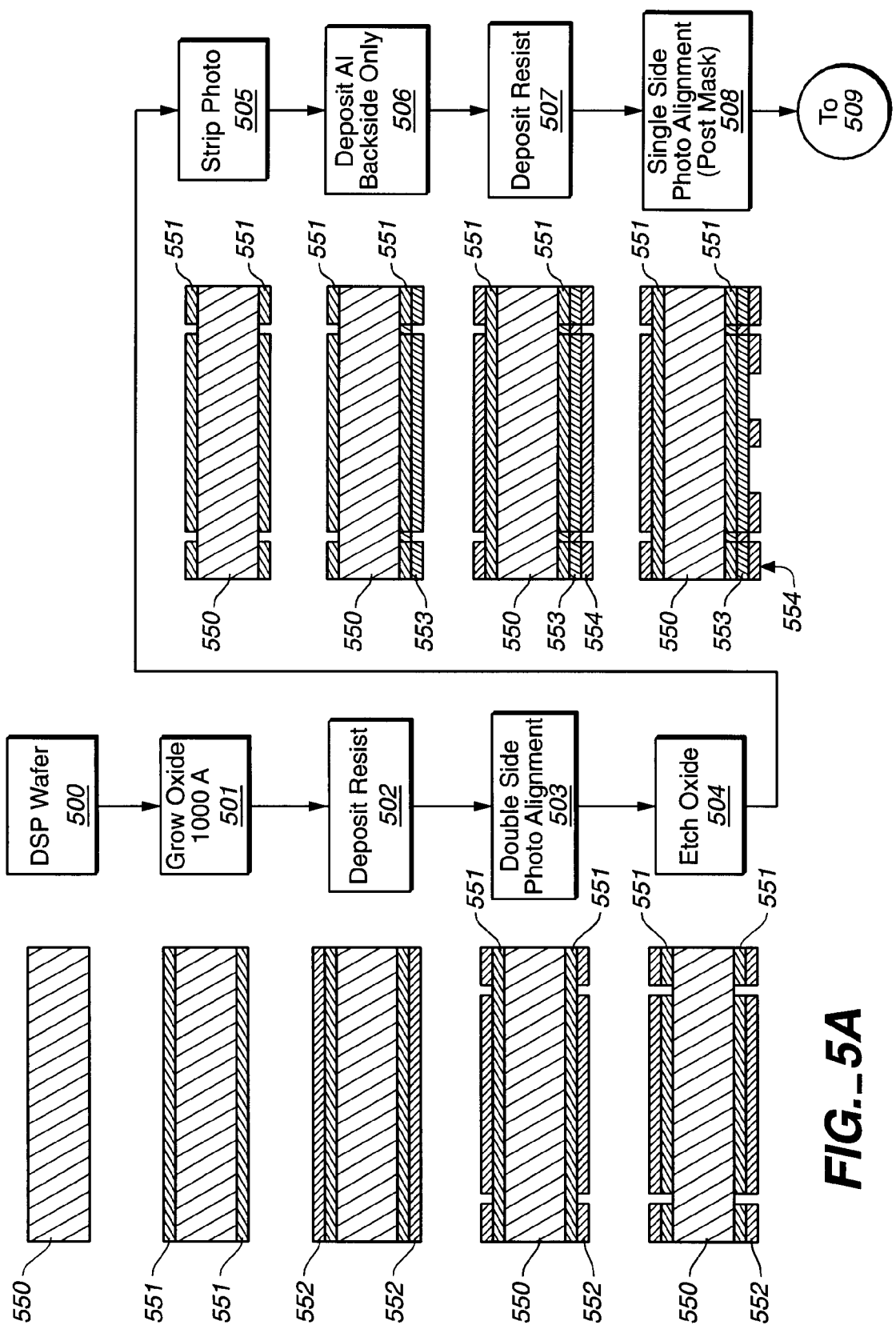
FIG._5A

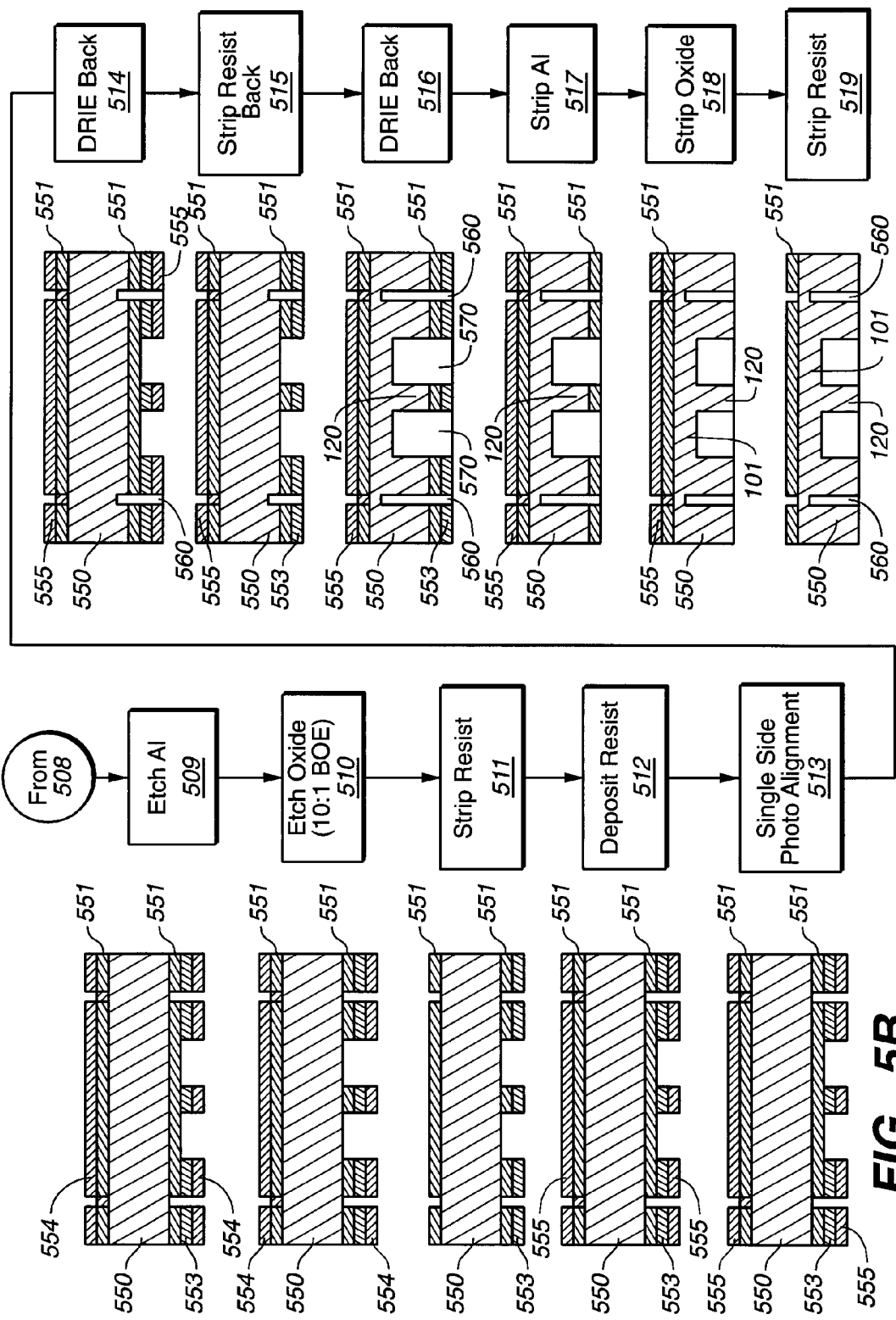
FIG._5B

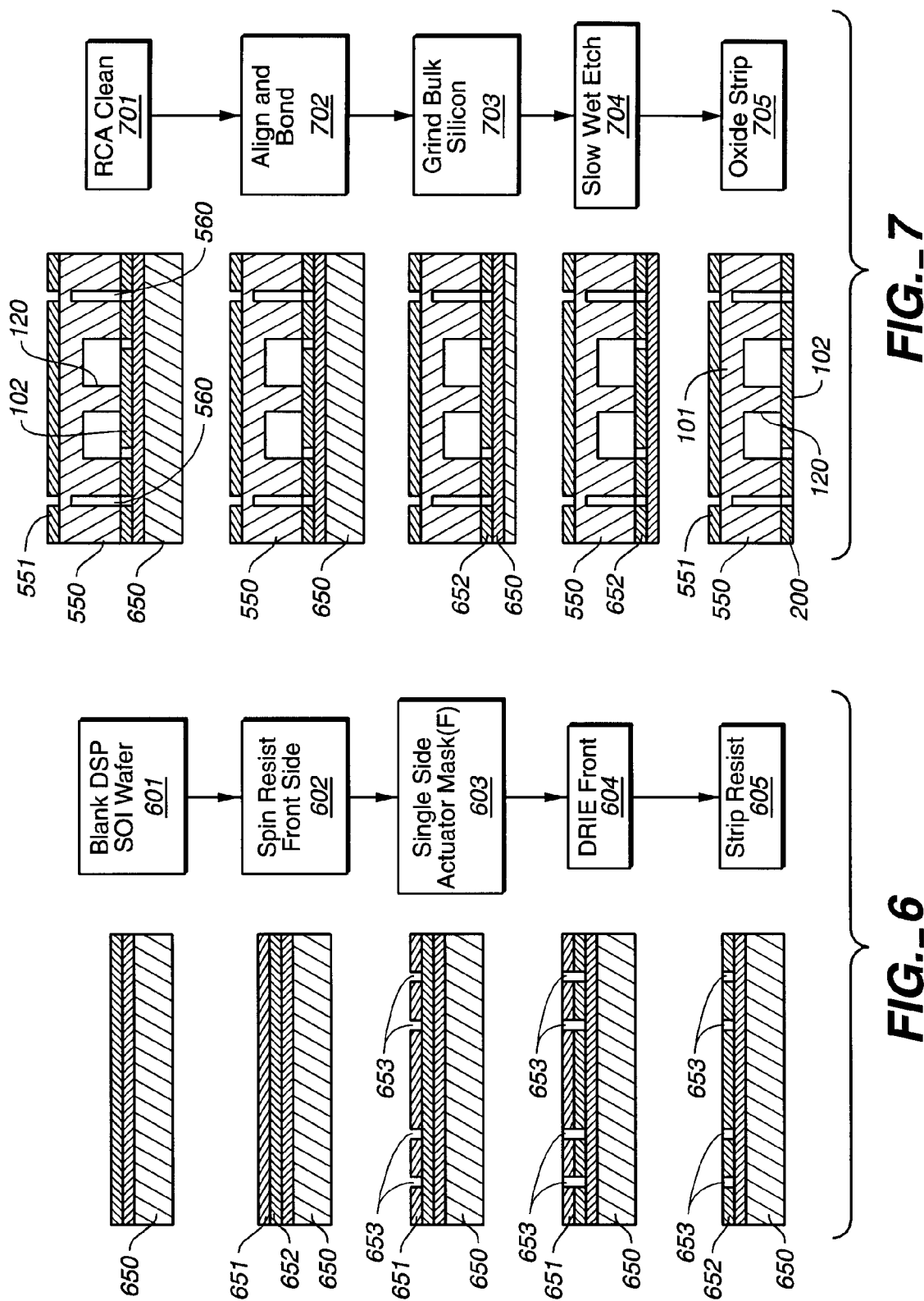

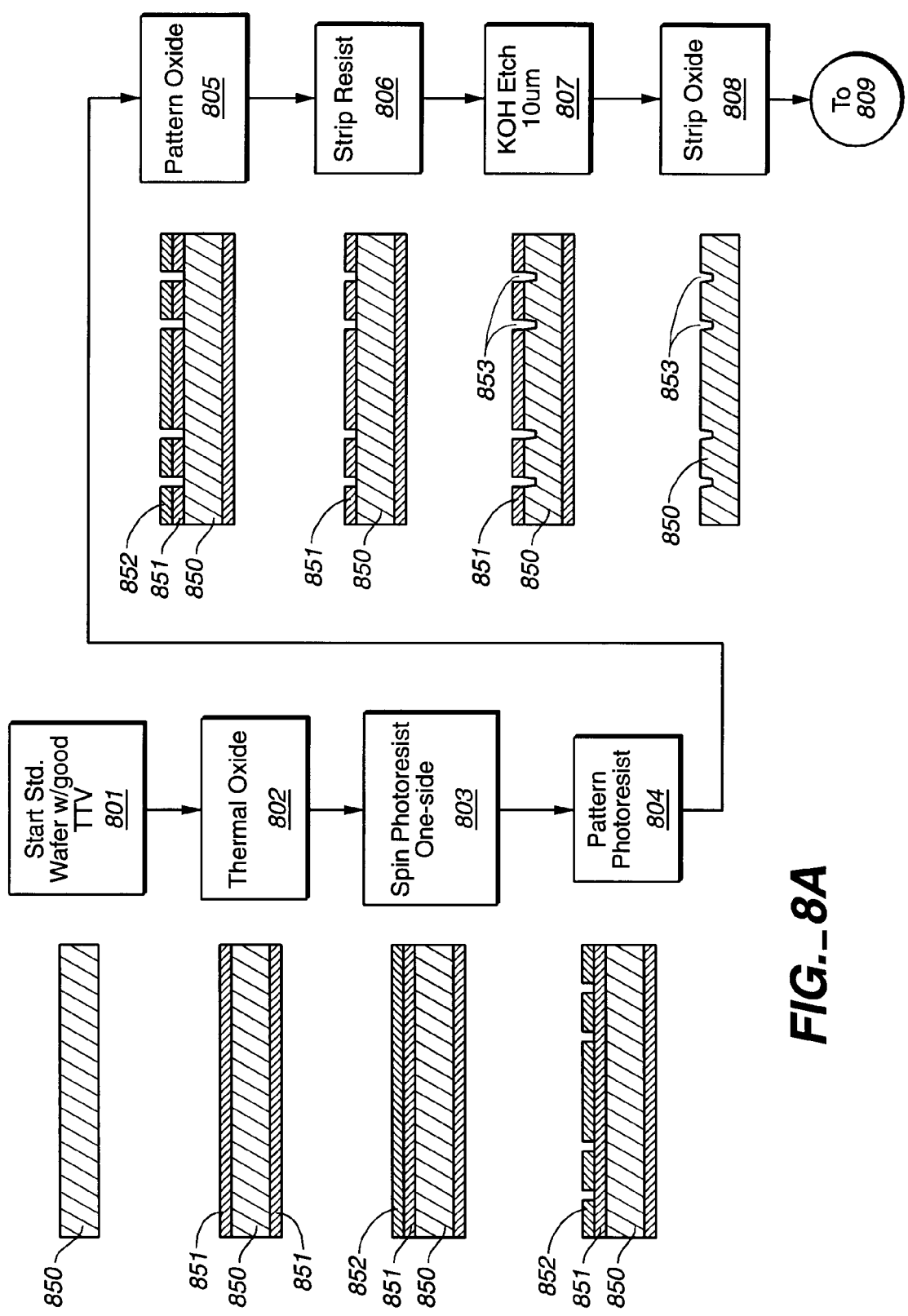
FIG._8A

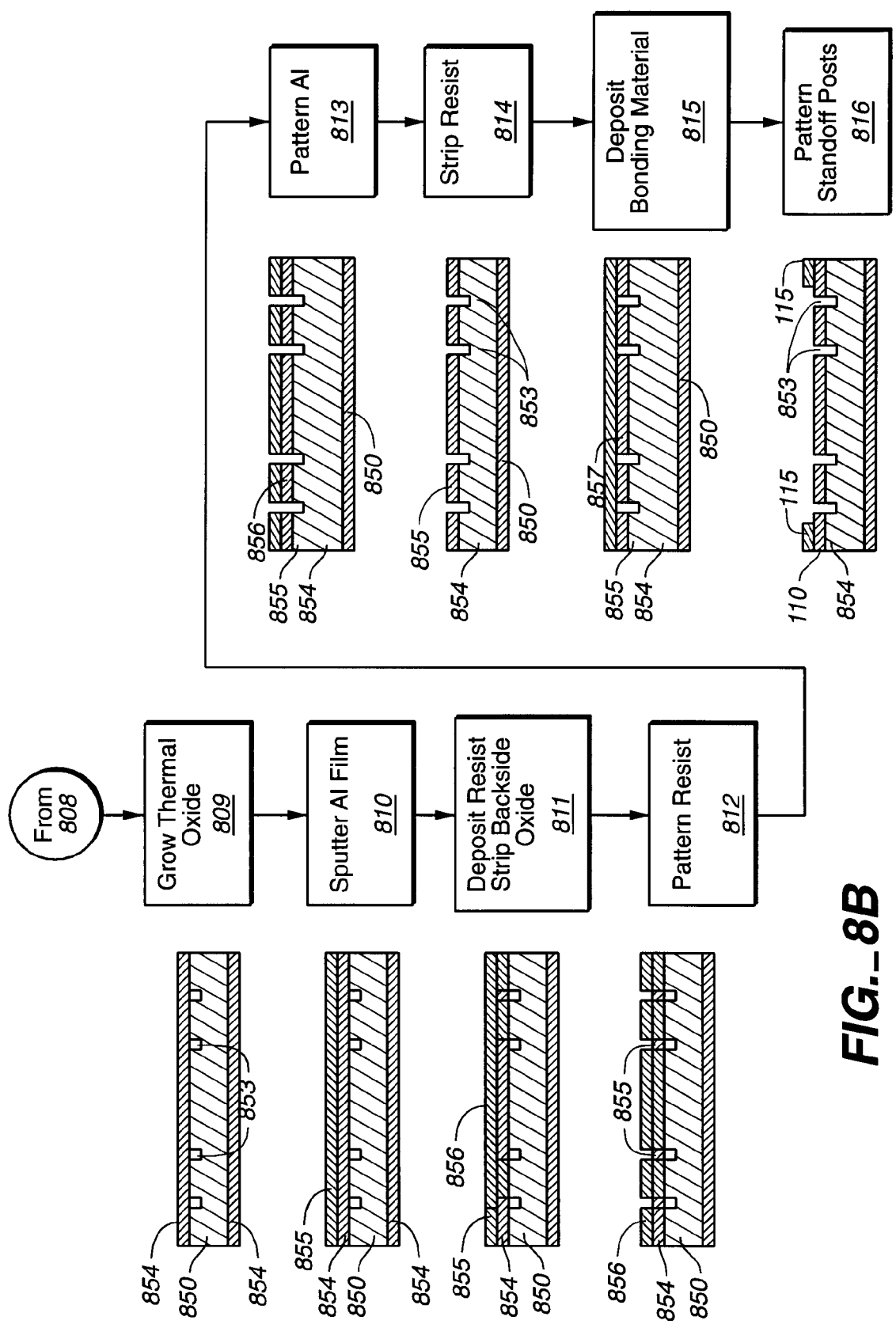
FIG._8B

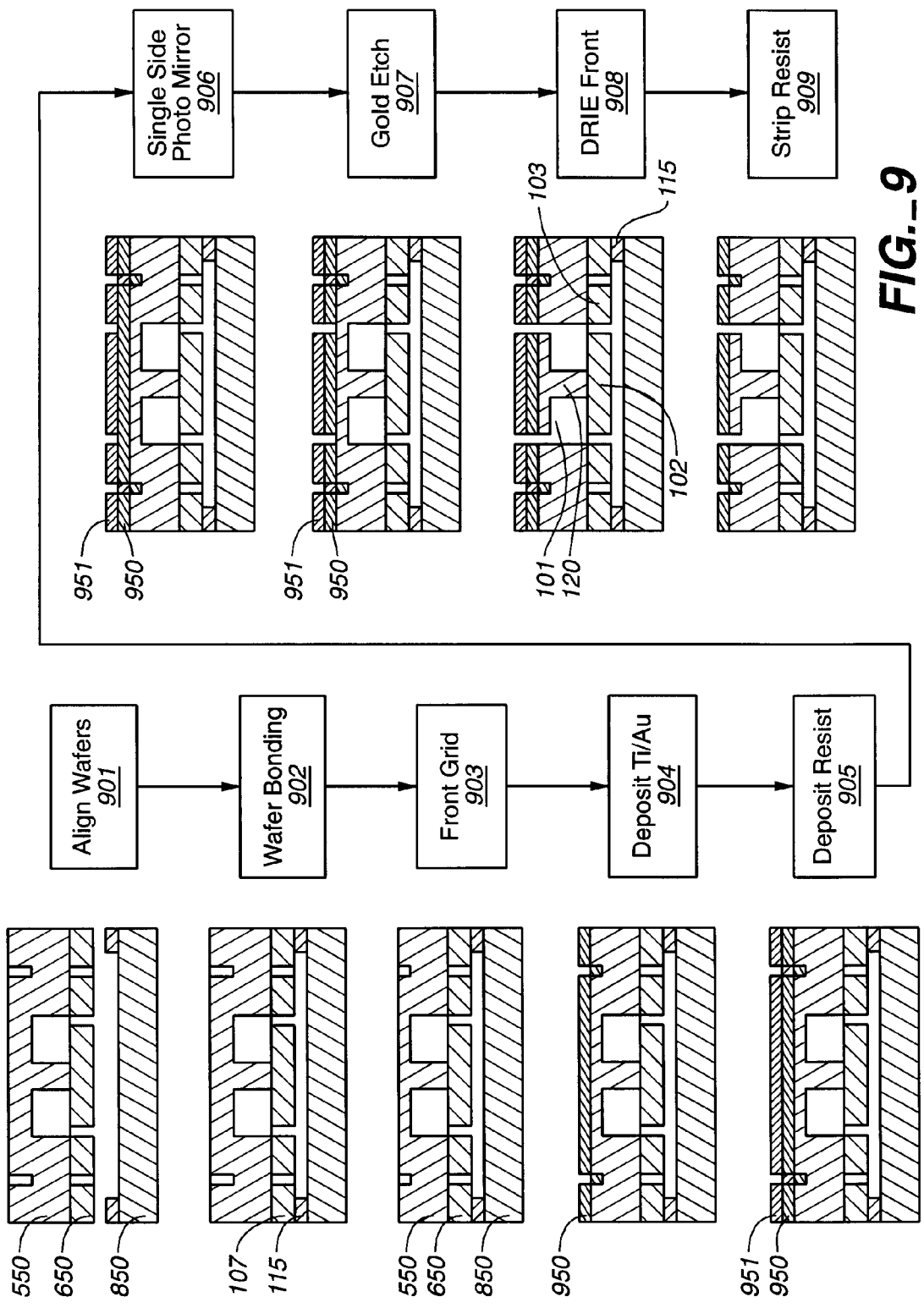

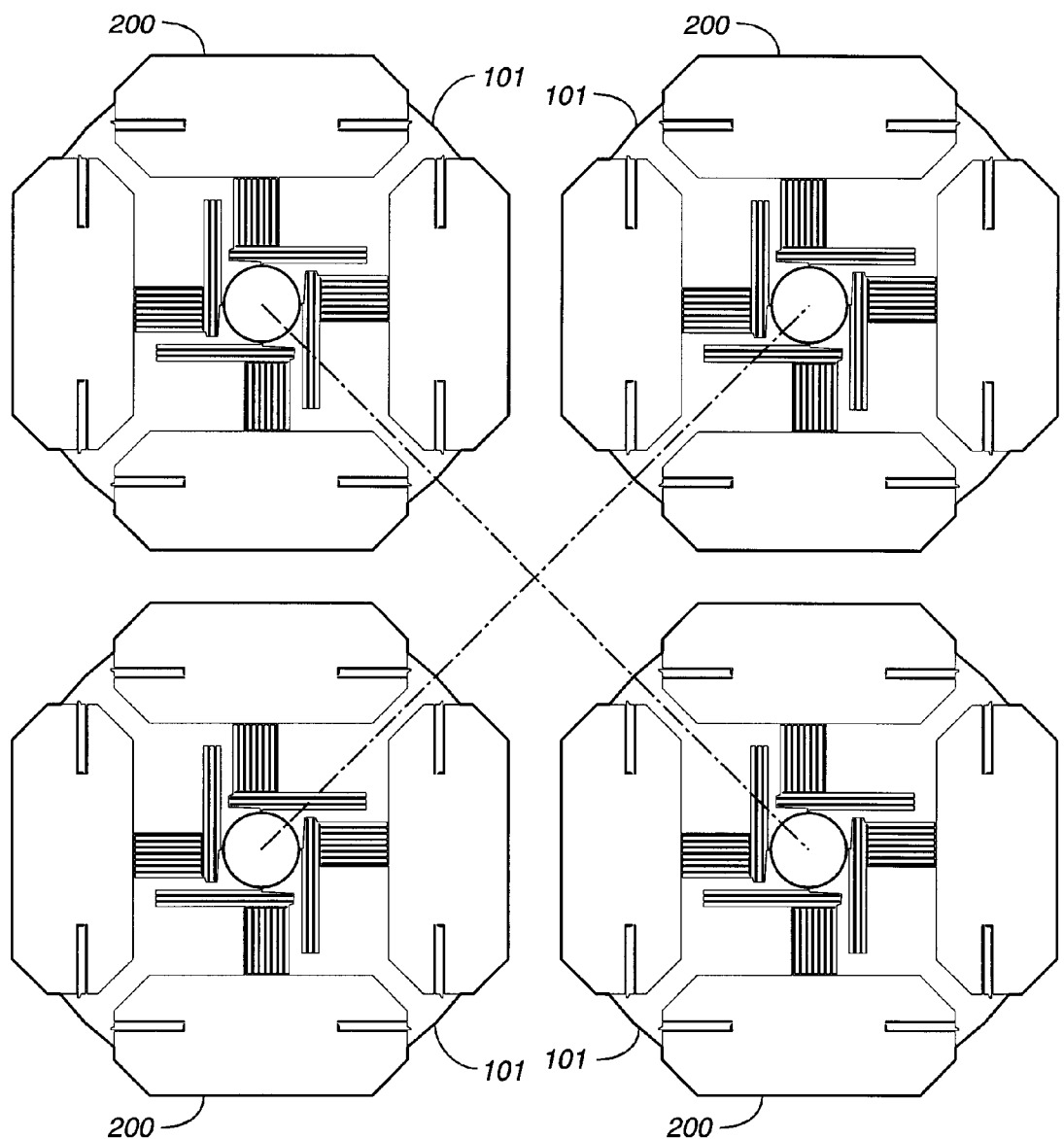
FIG._10

MICROELECTROMECHANICAL MIRROR AND MIRROR ARRAY

TECHNICAL FIELD

This invention relates to microelectromechanical mirrors and mirror arrays, and a method for manufacturing the same.

BACKGROUND

As the internet has grown, so too has the strain on the telecommunications infrastructure. As more and more information is transmitted across the Internet, and the demand for information rich content like streaming video has grown, telecommunication providers have struggled to provide the necessary bandwidths and data rates necessary to carry the requisite data. To that end, telecommunications providers have looked to carrying more and more data on fiber optic networks, and to extending the reach of their fiber optic networks beyond the network backbone.

One limitation of fiber optic networks as currently implemented is their inability to directly switch optically encoded packets of data from a fiber on a source network or network node to a fiber on a destination network or network node. Instead, the optically encoded data is dropped from the source network fiber, converted to electrically encoded data, switched to the destination network using conventional electronic switches, converted back into optically encoded data, and injected into the destination network fiber.

Micromachined mirror arrays offer the ability to directly switch optically encoded data in devices, known as all-optical cross connect switches, from a source fiber on a source network to a destination fiber on a destination network without having to convert the data from optical to electronic and back again. For such mirror arrays to be commercially useful, they must be able to cross connect approximately 1000 input fibers with an equal number of output fibers in a compact volume. This can be achieved with mirrors that can be densely packed together and that are rotatable by relatively large angles (~5°) in an arbitrary angular direction.

Recent developments in the field of microelectomechanical systems (MEMS) allow for the bulk production of microelectromechanical mirrors and mirror arrays that can be used in all-optical cross connect switches. MEMS-based mirrors and mirror arrays can be inexpensively designed and produced using conventional tools developed for the design and production of integrated circuits (IC's). Such tools include computer aided design (CAD), photolithography, bulk and surface micromachining, wet and dry isotropic and anisotropic etching, and batch processing. In addition, deep reactive ion etching methods (DRIE) allow silicon devices to be produced having high aspect ratios (~20:1) that rival those that can be achieved using the prohibitively expensive lithography, electroplating and molding process (LIGA) which requires access to a synchrotron radiation source. (LIGA is an acronym for the German lithographie, galvanoformung und abformung).

A number of microelectromechanical mirror arrays have already been built using MEMS production processes and techniques. These arrays have designs that fall into approximately three design categories, each of which suffers from one or more limitations that make them sub-optimal for use in an all-optical cross connect switch.

The first and simplest design is illustrated by U.S. Pat. No. 5,960,132 to Lin. In this design, a reflective panel is hinged to a reference base and is electrostatically rotated about the hinge. Since the panel's freedom of motion is limited to rotation about the hinge, light incident on the panel cannot be reflected in an arbitrary angular direction (dθ, dφ) but only along an arc defined by a single angle, i.e., dθ or dφ. As a result, light incident from a source fiber cannot be directed to an arbitrary output fiber but only to those output fibers located along the defined arc. Consequently, Lin's system requires large and costly system redundancies to connect a plurality of input fibers to a plurality of output fibers. These redundancies can be in either the number of output fibers or in the number of mirrors. In Lin, the redundancy is in the number of mirrors, where $N^2$ mirrors are used to connect N input fibers to N output fibers. An optimal system would only require N mirrors to make the N input to N output possible fiber interconnections.

A more sophisticated design is illustrated in U.S. Pat. No. 6,044,705 to Neukermans et al which is hereby incorporated by reference. In Neukermans, a gimbal is mounted on a first hinge connected to a reference surface, while a mirror is mounted on a second hinge connected to the gimbal. The first and second hinges are orthogonal to each other and allow the mirror to be rotated in an arbitrarily angular direction (dθ, dφ). The gimbal is electrostatically rotated about the first hinge by applying a potential between it and electrodes located on the reference surface. The mirror is electromagnetically rotated about the second hinge by injecting a current in a conductive coil wrapped around the mirror perimeter. The current flow through the coil generates a small magnetic moment which couples to a permanent magnetic field established across the plane of the mirror (e.g. with bar magnets), and causes the mirror to rotate. While Neukermans use of a gimbal thus allows the mirrored surface to rotate in an arbitrary angular direction, it also makes the system more mechanically and electrically complex than it needs to be. The mechanical complexity increases the sensitivity of the system to mechanical vibrations, while the electrical complexity increases the intricacy of the electrostatic and electromagnetic actuators. Both complexities increase the cost of producing the system. Additionally, Neukermans electromagnetic actuator coil occupies a large amount of the surface of the device, thus reducing the mirrored surface area and the mirror density.

A third mirror design is illustrated in U.S. Pat. No. 6,040,953 to Michalicek. In Michalicek, a mirror is mounted on a central post anchored to a locking pin joint that is carved into a reference surface. The post can be electrostatically actuated to freely rotate about the pin joint in an arbitrary direction. However, because the post is not mechanically attached to the pin joint with flexures, it can only be stably rotated in directions where the mirrored surface can be supported by a landing pad provided for that purpose. The mirror can therefore only be rotated and held in a fixed number of stable positions. In Michalicek's preferred embodiment, the mirror can only be rotated to and held in two stable positions.

BRIEF SUMMARY OF THE INVENTION

A freely rotatable, microelectromechanical mirror is disclosed. In one embodiment, the mirror can be used as a single switching element in an array of switching elements in an all-optical cross connect switch. The disclosed mirror includes a mirrored surface that can be mounted onto the top surface of a cylindrically shaped support post. The bottom surface of the support post can be mounted onto a freely movable, arbitrarily rotatable plate that is suspended in an actuation layer.

The actuation layer includes a freely movable plate suspended from and flexibly connected to a plurality of actuators that are themselves suspended from and flexibly connected to a support structure. In one embodiment, the support structure is a support frame held above a reference surface. In another embodiment the support structure is a plurality of support posts extending from the reference surface. The actuators can be actuated by any actuation means including electrostatic, electromagnetic, piezoelectric, and thermal actuation means. In one embodiment, the actuators are electrostatically actuated and the freely movable plate is suspended from and flexibly connected to three or more actuators that are distributed symmetrically about it. For example, in one preferred embodiment, the plate is suspended from and flexibly connected to four electrostatic actuators distributed about the plate at 90 degree intervals.

Each actuator is connected to the support structure by a plurality of actuator flexures that define a direction of motion in which the actuator can be actuated or moved. The direction of motion can be a linear direction of motion in which the actuator is translated, or an angular direction of motion in which the actuator is rotated. In a preferred embodiment, each actuator is connected to a support frame by a pair of torsional flexures that define an axis about which the actuator can be rotated. In this embodiment the actuator flexures functionally divide each actuator along its rotational axis into two ends that are respectively distal and proximal to the one or more plate flexures that connect the actuator to the freely movable plate.

Each of the plurality of actuators are connected to the freely movable plate by one or more plate flexures. In a preferred embodiment, each actuator is connected to the freely movable plate by two orthogonally oriented plate flexures. The first plate flexure connects the actuator to the second plate flexure and is configured to absorb energy transferred to the actuator from other components of the mirror. It serves to thereby decouple the actuator's motion from the motion of other mirror components. The second plate flexure is configured to extend when the actuator is actuated, and to pull the freely movable plate in the direction of the resulting restoring force. In a preferred embodiment, the second plate flexure is configured to pull the freely movable plate toward or away from a reference surface when the actuator is rotated toward or away from the freely movable about the two flexures that connect the actuator to the support frame.

The actuation layer can be held above a reference surface by a number of standoff posts. In a preferred embodiment, the standoff posts electrically isolate the actuation layer from the reference layer, and a bias voltage is applied to the actuation layer. For each actuator suspended in the actuation layer, actuation means are disposed to cause the movement of the actuator. In one embodiment, the actuation means are control electrodes configured to electrostatically move the actuators. In other embodiments the actuation means can be current loops and magnetic fields configured to electromagnetically move the actuators, or piezoelectric crystals configured to piezoelectrically move the actuators.

The actuation means are attached to addressing and switching circuitry allowing individual actuators to be selectively moved. Selective movement of an actuator causes the plate flexure connecting the actuator to the freely movable plate to extend and to pull the freely movable plate in the direction of the actuator's motion. Selective movement of two or more actuators allows for the selective movement of the freely movable plate by producing a net restoring force or a net torque on the plate. In one embodiment, the actuators can be selectively moved to rotate the freely movable plate in an arbitrary direction without stressing it. In another embodiment, the actuators can be selectively moved to translate the freely movable plate toward or away from a reference surface without rotating it.

For example, in a preferred embodiment each electrostatic actuator is suspended from a support frame by a pair of flexures about which it is configured to rotate. Distal and proximal control electrodes lie directly beneath the respective distal and proximal ends of each actuator. The control electrodes are attached to addressing circuitry that allows control voltages to be selectively applied to one or more of them. When a control voltage is applied to a control electrode, an attractive electrostatic force develops between the control electrode and the actuator lying above it, and causes the actuator to rotate toward the control electrode. As the actuator rotates toward a proximal (or distal) control electrode, it pushes (or pulls) the plate flexure connecting the actuator to the freely movable plate toward (or away from) the reference surface. In response, the plate flexure extends and exerts a restoring force that respectively pulls (or pushes) the freely movable plate toward (or away from) the reference surface, and toward the actuator.

When selective control voltages are applied to control electrodes lying beneath two or more electrostatic actuators, the actuators can be rotated in such a way that the plate flexures attaching the actuators to the freely movable plate create a net torque on the plate but no net force. Thus, the plate can be rotated about an arbitrary axis of rotation, defined by the net torque, without being translated or stressed. For example, when similar control voltages are applied to the proximal control electrode beneath a first electrostatic actuator attached to the freely movable plate, and to the distal control electrode beneath a second electrostatic actuator attached to the opposite side of the freely movable plate, the plate flexures attaching the actuators to the plate create a net torque on the plate but no net force. The net torque causes the plate to rotate, stress free, toward the first electrostatic actuator.

This freely movable, arbitrarily rotatable plate has several advantages over prior art actuated plates. First, since no net force is applied to the freely movable plate, it can be rotated without stressing it. Similarly, since the support post and mirrored surface are rigidly attached to the freely movable plate, they can be rotated stress free along with the plate. In addition, the opposing restoring forces created by opposing actuators that are selectively rotated allows a greater critical force to be applied to each of the actuators. The increased critical force allows a greater percentage (up to 80%) of the gap between the actuators and their control electrodes to be utilized, allowing the actuators to be rotated to larger critical angles than are possible in prior art actuators. Alternatively, the increased critical force allows the size of the gap between actuators and electrodes to be reduced, thereby allowing the actuators to be controllably rotated with smaller control voltages. Finally, the freely movable plate can be rotated by an angle that is magnified with respect to the angle by which the electrostatic actuators are rotated. The magnification factor is determined by the ratio of the distance from the flexures attaching the electrostatic actuators to the center of the freely movable plate, and the distance from the edge of the freely movable plate to its center.

In general, to rotate the mirror in an arbitrary angular direction ($d\theta$, $d\phi$), a minimum of three electrostatic actuators must be connected to the freely movable plate. While the three or more electrostatic actuators need not be symmetrically distributed around the plate, certain advantages are achieved when they are so distributed. In particular, symmetrically distributing the electrostatic actuators around the freely movable plate simplifies the control voltages that need to be supplied to the control electrodes to rotate the plate and attached mirror in an arbitrary angular direction.

The details of various embodiments of the invention are set forth in the accompanying drawings and the description below. Other features, objects and advantages of the invention will be apparent from the description, drawings and claims.

DESCRIPTION OF DRAWINGS

FIG. 1 is a perspective view of an electrostatically actuated microelectromechanical mirror in accordance with the present invention.

FIG. 2 is a view of the microelectromechanical mirror's electrostatic actuator layer.

FIG. 3 is a side view of the mirror illustrating its principle of rotation.

FIG. 4 is a side view of the microelectromechanical mirror illustrating the magnification of the mirror rotational angle.

FIGS. 5A–5B are an illustration of the process used to make the mirror support layer.

FIG. 6 is an illustration of the process used to make the electrostatic actuation layer.

FIG. 7 is an illustration of the process used to bond the electrostatic actuation layer to the mirror support layer.

FIGS. 8A–8B are an illustration of the process used to make the reference surface layer with control electrodes.

FIG. 9 is an illustration of the process used to bond the reference layer to the actuation and mirror support layers.

FIG. 10 is a view of the distribution of actuation layers in an array of microelectromechanical mirrors.

Like reference symbols in the various drawings indicate like elements.

DETAILED DESCRIPTION OF THE PREFERRED EMBODIMENT

An electrostatically actuated electromechanical mirror 100 in accordance with one embodiment of the present invention is shown in FIG. 1. In the embodiment of FIG. 1, mirror 100 consists of an elliptical mirrored surface 101 having a major axis of 1000 $\mu$M, a minor axis of 900 $\mu$m and a thickness of 25 $\mu$m. The mirrored surface is made elliptical to reduce the coupling of resonances between the orthogonal rotational directions of the mirror, and to better match the optical requirements when the mirror is used as a switching element in an all-optical cross connect switch. Other embodiments are possible however, and still within the scope of the invention. For example, the mirrored surface can be made circular, square, rectangular or elliptical with greater or lesser eccentricity than that disclosed in the embodiment described.

The mirrored surface 101 is mounted onto the top surface of a support post 120 having a radius of 70 $\mu$m, and a thickness of 50 $\mu$m. The height of support post 120 is chosen so that the intersection of mirrored surface 101 with actuators 103 or reference surface 110 during rotation of plate 102 forms a shock protection cage for mirror 100. The bottom surface of support post 120 is connected to the top surface of a freely movable, arbitrarily rotatable, electrostatically actuated plate 102 having a radius of 70 $\mu$m and a thickness of 25 $\mu$m.

As shown in FIG. 2, freely movable plate 102 is suspended from four electrostatic actuators 103 that are themselves suspended from a support frame 107 in an electrostatic actuation layer 200. The electrostatic actuators 103 are used to rotate freely movable plate 102 in an arbitrary angular direction. As plate 102 rotates, so do central support post 120 (FIG. 1) and mirrored surface 101 (FIG. 1) which are rigidly attached. Mounting mirrored surface 101 (FIG. 1) above electrostatically actuated plate 102 (FIG. 1) and actuation layer 200 allows a plurality of mirrors 100 (FIG. 1) to be packed densely together in a mirror array such that the surface of the array is largely mirrored. In this way, light can be readily switched from a plurality of input fibers to a plurality of output fibers in a compact volume in an all optical cross connect switch.

Electrostatic actuators 103 are 25 $\mu$m thick, 230 $\mu$m wide and 600 $\mu$m long. The actuators 103 are suspended from frame 107 by pairs of torsional flexures 106. The torsional flexures 106 are 25 $\mu$m thick, 40 $\mu$m wide and 150 $\mu$m long. They define axes of rotation 111 about which the electrostatic actuators 103 can rotate, and functionally divide each actuator 103 into two ends located on opposite sides of axis 111 that are respectively distal and proximal to plate 102. The distance from axis 111 to the center of plate 102 is 385 $\mu$m.

The electrostatic actuators 103 are connected to freely movable plate 102 via pairs of plate flexures 104 and 105. Plate flexures 104 couple each electrostatic actuator 103 to plate flexures 105 and flex about their symmetry axes 113. They are 25 $\mu$m thick, 110 $\mu$m wide and 150 $\mu$m long. Plate flexures 104 serve to absorb rotational energy transferred to electrostatic actuators 103 from other components of mirror 100 (FIG. 1), and to decouple the rotation of the actuator to which they are connected from the rotation of other mirror components. Plate flexures 105 couple plate flexures 104 to freely movable plate 102, and flex about their symmetry axes 114. They are 25 $\mu$m thick, 60 $\mu$m wide and 270 $\mu$m long. Plate flexures 105 serve to pull movable plate 102 toward or away from reference surface 110 (FIG. 1) when electrostatic actuators 103 are rotated about axes 111.

As shown in FIG. 3, actuator frame 107 is held away from reference surface 110 by a number of standoff posts 115. Four pairs of control electrodes 108 and 109 in reference surface 110 lie directly below and capacitively couple to the distal and proximal ends of the electrostatic actuators 103 that are suspended from the frame 107. The standoff posts 115 separate the control electrodes 108 and 109 from the actuators 103 by a 10 $\mu$m gap 308 when the actuators 103 are in their neutral or non-rotated state. In a preferred embodiment, standoff posts 115 are made from polyimide and serve to electrically isolate actuator frame 107, electrostatic actuators 103 and freely movable plate 102 from reference surface 110. In this embodiment, a bias voltage of negative 60 V is applied to the actuation layer 200 (FIG. 2) or to frame 107, actuators 103 and plate 102.

When a control voltage is applied to an electrode 109 under the proximal end of an actuator 103, a charge develops on electrode 109 that is proportional to the capacitive coupling between the electrode and the proximal end of the actuator 103. This charge creates an electrostatic force 305 between the proximal end of actuator 103 and electrode 109, substantially in the direction shown. The force has a magnitude that is proportional to the square of the difference between the bias voltage and the control voltage, and that is inversely proportional to the square of the gap 308 between actuator 103 and electrode 109. Force 305 exerts a torque 301 on actuator 103 about axis of rotation 111 (FIG. 2)

defined by flexures 106. The torque causes flexures 106 to extend, thereby allowing actuator 103 to rotate toward electrode 109. When a bias voltage of negative 60 V is applied to the actuation layer 200 (FIG. 2), a control voltage of positive 120 V causes actuator 103 to rotate toward electrode 109 by approximately 1 degree. As actuator 103 rotates, it pushes flexure 105 toward reference surface 110, causing it to extend as shown. As flexure 105 extends, it exerts a restoring force 302 substantially in the direction shown having a component 303 that pulls freely movable plate 102 toward reference surface 110, and a component 304 that pulls plate 102 toward flexure 106.

Similarly, when a control voltage is applied to an electrode 108' under the distal end of an actuator 103' that attaches to freely movable plate 102 at a point that is directly opposite the attachment point of actuator 103, a charge develops on electrode 108' that is proportional to the capacitive coupling between the electrode and the distal end of the actuator 103'. This charge creates an electrostatic force 305' between the distal end of actuator 103' and electrode 108' substantially in the direction shown. The force has a magnitude that is proportional to the square of the difference between the bias voltage and the control voltage, and that is inversely proportional to the square of the gap 308' between control electrode 103' and electrode 108'. Force 305' exerts a torque 301' on actuator 103' about axis of rotation 111' (FIG. 2) defined by flexures 106'. The torque causes actuator flexures 106' to extend, thereby allowing actuator 103' to rotate toward electrode 108'. As actuator 103' rotates, it lifts flexure 105' away from reference surface 110, causing it to extend as shown. As flexure 105' extends, it exerts a restoring force 302' substantially in the direction shown having a component 303' that pulls freely movable plate 102 away from reference surface 110, and a component 304' that pulls plate 102 toward flexure 106'.

When similar control voltages are applied to proximal electrode 109 beneath electrostatic actuator 103 and to distal electrode 108' beneath electrostatic actuator 103' as shown, flexures 105 and 105' extend as shown and exert respective restoring forces 302 and 302' substantially in the directions shown. Restoring forces 302 and 302' have respective components 303 and 303' that respectively push and pull freely movable plate 102 toward and away from reference surface 110 with equal force. Consequently, plate 102 does not experience a net vertical force and is not translated in the vertical direction. Nonetheless, force components 303 and 303' create a net torque about a virtual axis of rotation orthogonal to the plane of FIG. 3 and intersecting the plane at point 320. This torque causes movable plate 102 to rotate toward flexure 106 as shown. Restoring forces 302 and 302' also have respective components 304 and 304' that pull plate 102 in opposite lateral directions with equal force. Since no net lateral force is exerted on plate 102, the plate is not translated in the lateral direction of either force component 304 or 304'.

The two flexure electrostatic actuation method disclosed in FIG. 3 is one example of a multiple flexure actuation method that allows the freely movable plate to be rotated about an arbitrary axis of rotation (defined by the net torque) without being translated or stressed. In general, the multiple flexure actuation method involves selectively applying control voltages to the control electrodes beneath two or more of the suspended electrostatic actuators, so that the restoring forces exerted by the flexures attaching the actuators to the suspended plate will create a net torque on the plate, , but no net force, when the actuators are rotated.

This method of actuating freely movable plate 102 has several advantages over prior art actuation methods. One advantage, is that no stress is applied to plate 102 as it is rotated since no net force is applied to the plate. Similarly, since support post 120 and mirrored surface 101 are rigidly attached to plate 102, no stress is applied to either of these objects as they are rotated along with plate 102.

A second advantage is that the opposing restoring forces created by opposing actuators 103 and 103' that are selectively rotated allows a greater critical force to be applied to each actuator. For example, the upward component 303' of the restoring force of flexure 105' increases the critical force that can be applied to actuator 103. Similarly, the downward component 303 of the restoring force of flexure 105 increases the critical force that can be applied to actuator 103'. The critical force is the force at which the deflection of an electrostatic actuator 103 becomes unstable, and the actuator collapses upon one of its control electrodes 108 or 109. Since the force is inversely proportional to the square of the gaps 308 between the actuators 103 and their control electrodes 108 or 109, increasing the critical force increases the percentage of the gaps 308 that can be used to rotate the actuators 103. Consequently, actuators 103 can be rotated to larger critical angles than are possible in prior art actuators. For example, prior art actuators are typically able to utilize only 30% to 40% of the gap between the actuators and their electrodes. The disclosed actuation methods allows 80% of gap 308 to be used to rotate actuators 103. Alternatively, since the critical force is inversely proportional to the square of gap 308, increasing the critical force that can be applied to actuators 103 allows the size of gap 308 to be reduced, thereby allowing electrostatic actuators 103 to be controllably rotated with smaller control voltages.

As shown in FIG. 4, a third advantage of the multiple flexure electrostatic actuation method is that it allows plate 102 to be rotated by an angle that is magnified with respect to the angle by which actuators 103 and 103' are rotated. When electrostatic actuators 103 and 103' are respectively rotated about flexures 106 and 106' by angle $\theta_a$, plate 102 is rotated about virtual axis of rotation 320 by an angle $\theta_b$. If plate 102 has radius $r_b$ and the distance between virtual axis of rotation 320 and flexures 106 and 106' is $L_0$, then for small rotation angles ($\theta_a$, $\theta_b$<<1 radian), $\theta_b$ is related to $\theta_a$ by the expression:

$$\theta_b = (L_0/r_b) \cdot \theta_a \qquad 1$$

The ratio ($L_0/r_b$) defines the magnification factor for the angular rotation of plate 102. In a preferred embodiment, $L_0$ is 385 μm, $r_b$ is 70 μm, and plate 102 is rotated by an angle $\theta_b$ that is 5.5 times larger than the angle $\theta_a$ by which actuators 103 and 103' are rotated. Since actuators 103 are designed to rotate by as much as 1 degree, plate 102 and attached mirrored surface 101 can be rotated by as much as 5.5 degrees.

FIG. 3 discloses a method for rotating mirrored surface 101 by an arbitrary angle in a single angular direction. In general, to rotate mirrored surface 101 by an arbitrary angle in an arbitrary angular direction (dθ, dφ), a minimum of three electrostatic actuators 103 must be connected to electrostatically actuated plate 102. While the three or more electrostatic actuators 103 need not be symmetrically distributed around plate 102, certain advantages are achieved when they are so distributed. Thus, advantages are achieved when three electrostatic actuators 103 are distributed at 120 degree intervals around plate 102, or when four actuators 103 are distributed at 90 degree intervals around plate 102. Symmetrically distributing electrostatic actuators 103 around electrostatically actuated plate 102 simplifies the control voltages that need to be supplied to electrodes 108 and 109 to rotate mirrored surface 101 by an arbitrary angle in an arbitrary angular direction.

The microelectromechanical mirror 100 described in FIGS. 1–4 can be fabricated using standard IC processing steps as shown in FIGS. 5 through 9. As shown in FIG. 5A, the mirror support post 120 and mirrored surface 101 (both in FIG. 1) are made from a single crystal silicon wafer 550 according to the process disclosed in steps 500–519. In one embodiment, wafer 550 is a double-side-polished (DSP) wafer having a total thickness variation of less than 3 μm, however other single crystal wafers can be used. The first step 501 in the process is to grow a protective oxide layer 551 on both sides of wafer 550, and to deposit (step 502) a layer of photoresist 552 over both sides of oxide layer 551. Oxide layer 551 is preferably 1000 Å thick. Photo alignment marks are patterned (step 503) onto both sides of DSP wafer 550, and portions of oxide layer 551 underlying the photo alignment marks are etched away (step 504). The remaining photoresist 552 is stripped away (step 505), and a hard mask 553 is deposited (step 506) onto the backside of wafer 550. In one embodiment, hard mask 553 is a 1000 Å thick aluminum film, but other hard masks may be used.

Hard mask 553 serves to mask portions of wafer 550 in later deep reactive ion etching (DRIE) process steps. A new layer of photoresist 554 is deposited (step 507) on both sides of wafer 550, and a mask of support post 120 is patterned (step 508) onto the bottom photoresist layer 554. Now referring to FIG. 5B, portions of hard mask 553 that are exposed by the support post mask are etched away (step 509) using a suitable etchant. Similarly, portions of protective oxide layer 551 that are exposed by the support post mask are etched away (step 510) with a buffered oxide etch. The remaining photoresist 554 is stripped away (step 511) and a third layer of resist 555 is deposited (step 512) onto both sides of wafer 550. Alignment marks are transferred (step 513) to the bottom resist layer 555 to define two alignment bores 560 that are pre-etched (step 514) into wafer 550 using a deep reactive ion etch (DRIE). In one embodiment, alignment bores 560 are pre-etched approximately 40 um deep using a Bosch-type DRIE, however other DRIE chemistries may be used. Similarly, other process steps allowing for the creation of high aspect ratio bores may be used such as LIGA process steps.

Once the alignment bores have been pre-etched, the bottom resist layer 555 is stripped away (step 515), and the alignment bores 560 are completely etched (step 516) into wafer 550, as are a pair of bores 570 that define support post 120 and the base of mirrored surface 101 (see FIG. 1). In one embodiment, alignment bores 560 and support post bores 570 are etched an additional 50 um using a Bosch-type DRIE. Finally, the processing of wafer 550 is completed by stripping off (step 517) hard mask 553, bottom oxide layer 551 (step 518), and top photoresist layer 555 (step 519). What remains is wafer 550 with a top oxide layer 551, two alignment bores 560, and two bores 570 that define mirror support post 120 and the base of mirrored surface 101 (FIG. 1).

As shown in FIG. 6, the entire electrostatic actuation layer 200 (see FIG. 2) is made from a single crystal silicon wafer 650 by the process disclosed in steps 601–605. In one embodiment, wafer 650 is a double-side-polished (DSP) silicon-on-oxide (SOI) wafer. In that embodiment, the bulk of SOI wafer 650 is used merely to safely handle the delicate actuation layer 200 (FIG. 2) that is built on upper silicon layer 652. The process begins by spinning (step 602) a layer of photoresist 651 onto the front side of SOI wafer 650. The entire electrostatic actuation layer 200 (FIG. 2) is patterned (step 603) onto photoresist layer 651 with an actuator mask. As shown in FIG. 2, actuation layer 200 includes support frame 107, electrostatic actuators 103, actuator flexures 106, freely movable plate 102, and plate flexures 104 and 105. Referring again to FIG. 6, the actuator mask also patterns alignment marks 653 onto photoresist layer 651 to later align SOI wafer 650 with wafer 550. The portions of upper silicon layer 652 exposed by the actuator mask are etched away (step 604) in a DRIE process step. In one embodiment, the actuation layer 200 is etched away using a 25 μm deep Bosch-type DRIE. The remaining photoresist layer 651 is stripped away (step 605), leaving the structures of the actuation layer 200 (FIG. 2), and alignment bores 653 carved into upper layer 652 of SOI wafer 650. While steps 601–605 have described a method of making actuation layer 200 (FIG. 2) using an SOI wafer 650, other single crystal silicon wafers may be used.

As shown in FIG. 7, SOI wafer 650 and wafer 550 are fusion bonded together in steps 701–705 after both wafer have been individually processed as disclosed in FIGS. 5 and 6. The first step in the bonding process is to thoroughly cleaned (step 701) wafers 550 and 650 to remove unwanted contaminants and to ensure a good silicon-on-silicon bond. In one embodiment, wafers 550 and 650 are cleaned using the Radio Corporation of America (RCA) cleaning process. Wafers 550 and 650 are then aligned along their respectively etched alignment bores 560 and 653, and are fusion bonded (step 702) together. The alignment of wafers 550 and 650 is such that mirror support post 120 (FIG. 1) of wafer 550 is fusion bonded to freely movable plate 102 (FIG. 2) of upper layer 652 of SOI wafer 650 in step 702. Thus, after step 702, any distinctions made between mirror support post 120 and freely movable plate 102 are merely formal and made to ease the description of the invention. Nonetheless, the process as disclosed allows one to make a freely movable plate that need not be bonded to a mirror support post or mirror, and the invention is not limited to the actuation of a mirrored surface. Once wafers 550 and 650 are fusion bonded together, the bulk of SOI wafer 650 is ground away (step 703), while the remainder is etched away (step 704) in a slow KOH etch. Finally, the oxide layer is stripped away (step 705), leaving electrostatic actuation layer 200 (FIG. 2), including movable plate 102 fusion bonded to support post 120, a base for mirrored surface 101, and a protective oxide layer 551 on top.

As shown in FIGS. 8A–8B, reference surface 110 (FIG. 1) is readily made from a single crystal silicon wafer 850 by the process disclosed in steps 801–816. The first process step is to select (step 801) a silicon wafer 850 that is suitably flat. In one embodiment, wafers 850 having a total thickness variation of less than 3 um are chosen. A thermal oxide layer 851 is grown (step 802) on wafer 850, and a layer of photoresist 852 is spun (step 803) onto the top of wafer 850. The photoresist layer 852 is patterned (step 804) with a mask to carve divots out of wafer 850. Portions of oxide layer 851 exposed by the divot mask are etched away (step 805), and the remaining photoresist is stripped away (step 806). Divots 853 are carved (step 807) into wafer 850 using a KOH etch. In one embodiment, divots 853 are 10 um deep by 10 um wide by 10 microns long, and are carved into wafer 850 to provide clearance for actuator flexures 105 when actuators 103 are maximally rotated (FIG. 2). As previously disclosed, in one embodiment actuators 103 can be rotated by angles as large as 1 degree. When they are, flexures 105 can be deflected by as much as 16 um, which is 6 um more than gap 308 between actuator frame 107 and reference surface 110

(FIG. 3). In that embodiment, divots 853 are carved into wafer 850 to provide for these large deflections.

Referring to FIG. 8B, once divots 853 have been carved into wafer 850, oxide layer 851 is stripped away (step 808), and a new 1 um thick thermal oxide layer 854 is grown (step 809) on both sides of wafer 850. A conductive layer 855 is sputtered (step 810) onto top oxide layer 854, and a layer of photoresist 856 is deposited (step 811) over conductive layer 855 while back oxide layer 854 is stripped away. In one embodiment, conductive layer 855 is a 1.2 um thick aluminum layer, however other conductive layers are possible. Photoresist layer 856 is patterned (step 812) with a mask for control electrodes 108 and 109 (FIG. 3) and for traces from the control electrodes to externally located bonding pads. Portions of conductive layer 855 exposed by the control electrode mask are etched away (step 813), and the remaining photoresist is stripped from the surface (step 814).

An optional mechanical stopping layer can be deposited and patterned onto the top surface of wafer 850 to electrically isolate actuators 103 and flexures 104 and 105 (FIG. 2) from control electrodes 108 and 109 (FIG. 3) during rotation of plate 102 (FIG. 2). A plurality of materials can be used for this isolation layer including PMMA, SU-8, BCB, polyimides, polyimides optimized for LCD processing, silicon nitride, silicon-rich silicon nitride, and silicon dioxide. Materials such as silicon-rich silicon nitride and polyimides optimized for LCD processing may be preferable since they provide a small leakage path to ground, and can therefore prevent long term voltage drift effects by readily dissipating charge buildup. In one embodiment, the mechanical stopping layer is a 1 $\mu$m thick polyimide layer patterned and etched to produce an array of polyimide dots or a sequence of polyimide stripes on the surface of wafer 850. The layer prevents electrical shorts between the components of actuation layer 200 (FIG. 2) and control electrodes 108 and 109 (FIG. 3) when plate 102 is rotated beyond its designed range.

Once the control electrodes and any mechanical stopping layer are made, a separation layer 857 is deposited (step 815) onto the top surface of wafer 850, and a standoff post mask is patterned onto it. In one embodiment, separation layer 857 is a 10 um thick polyimide layer, however other materials such as low temperature solders may be used. Portions of separation layer 857 exposed by the standoff post mask are etched away (step 816), leaving the reference surface 110 (FIG. 3) with an oxidized top surface 854, flexure divots 853, control electrodes 108 and 109 (FIG. 3) together with their electrical traces, and standoff posts 115.

As shown in FIG. 9, processing on electrostatically actuated mirror 100 is completed when reference surface 110 is bonded (steps 901–903) to actuation layer 200 (FIG. 2), and mirror support post 120, and mirrored surface 101 is etched (steps 904–910) out of wafer 550. In the first processing step, wafer 850 is aligned (step 901) with fused wafers 650 and 550 so that the standoff posts 115 (FIG. 3) on wafer 850 are properly aligned with the support frame 107 (FIG. 3) on wafer 650. The wafers are bonded together (step 903) using a low temperature bonding technique such as a solder bond, a eutectic bond, a polymeric bond, or a thermo-compression bond. The maximum bonding temperature is chosen to be compatible with the thermal budget of the control electrodes and addressing circuitry etched into wafer 850. In general, the maximum thermal budget of the addressing circuitry and control electrodes will be in the range of 350° C. to 425° C., so that the maximum bonding temperature is chosen to be less than 350° C. In one embodiment, standoff posts 115 (FIG. 3) are made from a 10 $\mu$m thick polyimide layer, and a polymeric bonding technique is used to bond wafer 850 to fused wafers 550 and 650 under appropriate conditions of temperature and pressure.

A reflective layer 950 is deposited (step 904) onto the top surface of wafer 550. In one embodiment, reflective layer 950 consists of a 1000 Å thick gold layer deposited over a 100 Å thick titanium layer, however other reflective layers are possible. A photoresist layer 951 is deposited (step 905) over reference layer 950, and a mirror mask is patterned (step 906) onto it. Portions of reference layer 950 exposed by the mirror mask are etched away (step 907). Similarly, portions of wafer 550 exposed by the mirror mask are etched away (step 908) thereby freeing mirrored surface 101. The remaining photoresist is stripped away (step 909), leaving the microelectromechanical mirror 100 as shown in FIG. 1.

In final release step 908, some undesired etching of plate and actuator flexures 104–106 (FIG. 2) can occur. This undesired etching is particularly true in mirror geometries where the length and flexibility of flexures 104–106 (FIG. 2) are insufficient to dissipate the heat generated by the DRIE process at the surface of mirror wafer 550. As mirror wafer 550 heats up, a partial loss of the masking layer protecting flexures 104–106 (FIG. 2) can occur, exposing the flexures to the etch. To minimize this exposure, a number of techniques can be employed. The first technique is to use a two step etch, where the first etch is a DRIE etch to remove the bulk of the exposed portions of wafer 550. This etch proceeds until the exposed portions of wafer 550 become so thin that flexures 104–106 (FIG. 2) become better able to conduct away the heat generated by the DRIE etch. At that point a lower power etch is used to complete the release of mirrored surface 101. For example, in one embodiment a freon/$SF_6$ etch is used as the second etch step.

The second technique to minimize the exposure of flexures 104–106 (FIG. 2) in process step 908 is to use a hard etch mask such as a metal mask or an oxide mask to protect the flexures. For example, in one embodiment an aluminum mask is used. A photoresist mask can be used together with the hard mask. For example, the entire surface of wafer 550 can be covered with a hard mask such as an Al mask, while the outer edges of the wafer can be covered with a photoresist mask. Portions of wafer 550 exposed by the mirror mask can be pre-etched before stripping away the photoresist mask. By optimizing the area of the photoresist mask and the pre-etch time, the time needed to release mirrored surface 101 through etching can be minimized, thereby minimizing the exposure of flexures 104–106 (FIG. 2) to etching. Finally, the third technique to minimize the exposure of flexures 104–106 (FIG. 2) is to make mirrored surface 101 (FIG. 1) large enough to shield flexures 104–106 (FIG. 2) during release etch 908.

As is well known in the art of IC manufacturing, the process disclosed in FIGS. 5–9 for making an individual mirror 100 can be readily adapted to make a plurality of mirrors in a mirror array by regularly repeating the process mask for individual mirror 100 in the desired mirror array geometry. In one embodiment the process masks are repeated to produce a mirror array as shown in FIG. 10. As shown in FIG. 10, four actuation layers 200 corresponding to four mirrors 100 (FIG. 1) arranged in a 2×2 array are shown. In general, an array of mirrors 100 (FIG. 1) of arbitrary dimensions can be made. In one embodiment, a 30×40 mirror array is made for use in an all optical cross connect switch.

A number of specific embodiments of the invention have been described. Nevertheless, it will be understood that various modifications may be made without departing from the spirit and scope of the invention. For example, the mirror can be made by different process steps than the steps disclosed here, or the order of two or more process steps or sequences of process steps can be interchanged. For example, the DRIE steps can be replaced with equivalent LIGA steps, and different etchants and masking materials can be used in some or all of the disclosed process steps. For example, the mirrored surface can be plated with any highly polished metallic surface such as a silver surface.

While the invention has been described using four electrostatic actuators and control electrodes that are symmetrically distributed about the movable plate, different numbers and types of actuators can be used and need not be symmetrically distributed about the movable plate. Similarly, different actuation means can be used. For example, electromagnetic, piezoelectric, or thermal actuation means can be used. Two, three, or more actuators can be used to move the plate and mirror. The actuators can be asymmetrically distributed about the plate and the control voltages asymmetrically applied to obtain the desired plate movement.

While the invention has been described as having the actuators suspended from a support frame held above a reference surface by a plurality of standoff posts, the actuators can be suspended from a plurality of support posts extending from the reference surface. While the invention has been described as selectively moving the actuators to rotate the freely movable plate, the invention can be used to translate the plate toward or away from the reference surface without rotating it. For example, referring back to FIG. 3, when similar control voltages are applied to the distal electrodes 108 and 108' respectively controlling actuators 103 and 103', actuator 103' will rotate clockwise in the direction 301' while actuator 103 will rotate counterclockwise, opposite to the direction 301 indicated in FIG. 3. As a result of these rotations, flexures 105 and 105' will be pulled away from reference surface 110 and will extend to respectively pull plate 102 away from surface 110 and toward actuators 103 and 103'. The net restoring force exerted on plate 102 will be a vertical restoring force pulling plate 102 away from reference surface 110 without rotating it. Plate 102 can be similarly pushed toward reference surface 110 by selectively applying similar voltages to proximal electrodes 109 and 109'.

Accordingly, these and other embodiments of the invention are within the scope of the following claims.

What is claimed is:

1. An electrostatically actuated plate, comprising:
   a reference surface having a plurality of control electrodes;
   a support frame held above the reference surface by a plurality of standoff posts;
   a plurality of electrostatic actuators flexibly suspended from the support frame and respectively held over the plurality of control electrodes; and
   a freely movable plate flexibly suspended from the plurality of electrostatic actuators and held above the reference surface.

2. The plate of claim 1, wherein each electrostatic actuator is suspended from the support frame by a pair of torsional flexures that define an axis of rotation about which the electrostatic actuator is rotatable toward its respective control electrode.

3. The plate of claim 2, wherein the freely movable plate is flexibly suspended from the plurality of electrostatic actuators by a respective plurality of torsional flexures.

4. The plate of claim 3, further comprising addressing circuitry to selectively apply voltages to selected ones of the plurality of control electrodes to selectively rotate respective ones of the plurality of electrostatic actuators toward their control electrodes.

5. The plate of claim 4, wherein each electrostatic actuator is held above a respective pair of control electrodes having first and second members and is rotatable in first and second directions toward the respective first and second members of the pair of control electrodes.

6. The plate of claim 5, wherein each torsional flexure connecting an electrostatic actuator to the freely movable plate is configured to pull the plate away from the reference surface and toward the electrostatic actuator when the actuator is rotated in the first direction, and to pull the plate toward the reference surface and toward the electrostatic actuator when the actuator is rotated in the second direction.

7. The plate of claim 6, wherein the freely movable plate is configured to rotate by an arbitrary angle in an arbitrary angular direction by applying selected voltages to selected ones of the plurality of control electrodes.

8. The plate of claim 7, wherein the plurality of electrostatic actuators can be rotated to critical angles that are proportional to critical forces, further comprising extending the critical force that can be applied to a selected one of the electrostatic actuators by selectively rotating selected others of the plurality of electrostatic actuators.

9. The plate of claim 7, wherein the plurality of electrostatic actuators are rotated by a first angle, and wherein the freely movable plate is configured to be rotated by a second angle that is a magnification of the first angle.

10. The plate of claim 9, wherein the plurality of electrostatic actuators are symmetrically distributed about and flexibly connected to the freely movable plate.

11. The plate of claim 10, wherein the plurality of electrostatic actuators symmetrically distributed about the freely movable plate comprise three electrostatic actuators distributed about the plate at 120 degree intervals.

12. The plate of claim 10, wherein the plurality of electrostatic actuators symmetrically distributed about the freely movable plate comprise four electrostatic actuators distributed about the plate at 90 degree intervals.

13. A microelectromechanical mirror, comprising:
   a reference surface having a plurality of control electrodes;
   a support frame held above the reference surface by a plurality of standoff posts;
   a plurality of electrostatic actuators flexibly suspended from the support frame and respectively held over the plurality of control electrodes;
   a freely movable plate flexibly suspended from the plurality of electrostatic actuators and held above the reference surface; and
   a mirrored surface connected to the freely movable plate.

14. The mirror of claim 13, wherein the mirrored surface comprises a highly polished metal.

15. The mirror of claim 13, further comprising a mirror support post coupled between the freely movable plate and the mirrored surface.

16. The mirror of claim 13, wherein each electrostatic actuator is suspended from the support frame by a pair of torsional flexures that define an axis about which the electrostatic actuator is rotatable toward its respective control electrode.

17. The mirror of claim 13, wherein the freely movable plate is flexibly suspended from the plurality of electrostatic actuators by a respective plurality of torsional flexures.

18. The mirror of claim 16, further comprising addressing circuitry to selectively apply voltages to selected ones of the plurality of control electrodes to selectively rotate respective ones of the plurality of electrostatic actuators toward their control electrodes.

19. The mirror of claim 18, wherein each electrostatic actuator is held above a respective pair of control electrodes having first and second members and is rotatable in first and second directions toward the respective first and second members of the pair of control electrodes.

20. The mirror of claim 19, wherein each torsional flexure connecting an electrostatic actuator to the movable plate is configured to flexibly pull the plate away from the reference surface and toward the electrostatic actuator when the actuator is rotated in the first direction, and to flexibly pull the plate toward the reference surface and toward the electrostatic actuator when the actuator is rotated in the second direction.

21. The mirror of claim 19, wherein the mirrored surface is configured to rotate by an arbitrary angle in an arbitrary angular direction by applying selected voltages to selected ones of the plurality of control electrodes.

22. The mirror of claim 19, wherein the plurality of electrostatic actuators can be rotated to critical angles that are proportional to critical forces, further comprising extending the critical force that can be applied to a selected one of the electrostatic actuators by selectively rotating selected others of the plurality of electrostatic actuators.

23. The mirror of claim 19, wherein the plurality of electrostatic actuators are rotated by a first angle, and wherein the freely movable plate is configured to be rotated by a second angle that is a magnification of the first angle.

24. The mirror of claim 21, wherein the plurality of electrostatic actuators are symmetrically distributed about and flexibly connected to the freely movable plate.

25. The mirror of claim 24, wherein the plurality of electrostatic actuators coupled to the freely movable plate comprise three electrostatic actuators.

26. The mirror of claim 24, wherein the plurality of electrostatic actuators coupled to the electrostatically actuated plate comprise four electrostatic actuators.

27. A freely movable plate, comprising:
a plurality of actuators flexibly suspended over a reference surface from a support structure;
a plurality of actuation means for respectively actuating the plurality of actuators; and
a freely movable plate flexibly suspended from the plurality of actuators by a plurality of torsional plate flexures.

28. The plate of claim 27, wherein the support structure comprises a support frame held over the reference surface by a plurality of standoff posts.

29. The plate of claim 27, wherein the support structure comprises a plurality of standoff post pairs, and wherein each actuator is suspended over the reference surface by a respective pair of standoff posts.

30. The plate of claim 27, further comprising addressing circuitry to selectively apply power to selected ones of the plurality of actuation means to selectively actuate respective ones of the plurality of actuators.

31. The plate of claim 30, wherein the freely movable plate is controllably moved in a selected direction by selectively actuating selected ones of the plurality of actuators.

32. The plate of claim 31, wherein the freely movable plate is controllably moved in a vertical direction toward or away from the reference surface.

33. The plate of claim 31, wherein the freely movable plate is controllably rotated about an arbitrary angle of rotation.

34. The plate of claim 30, wherein the plurality of actuators are from among the group comprising electrostatic, electromagnetic, piezoelectric, and thermal actuators.

35. The plate of claim 34, wherein the actuation means for respectively actuating the plurality of actuators are respectively from among the group comprising electrostatic, electromagnetic, piezoelectric, and thermal actuation means.

36. The plate of claim 35, wherein the plurality of actuation means for respectively actuating the plurality of actuators comprise means for respectively rotating the plurality of actuators.

37. The plate of claim 36, wherein the plurality of actuators are configured to rotate and are flexibly suspended from the reference surface by a respective plurality of torsional flexures.

38. The plate of claim 35, wherein the plurality of actuation means for respectively actuating the plurality of actuators comprise means for respectively translating the plurality of actuators.

39. The plate of claim 36, wherein the plurality of actuators are configured to be translated and are flexibly suspended from the reference surface by a respective plurality of bendable flexures.

40. A microelectromechanical mirror, comprising:
a plurality of actuators flexibly suspended over a reference surface from a support structure;
a plurality of actuation means for respectively actuating the plurality of actuators;
a freely movable plate flexibly suspended from the plurality of actuators by a plurality of torsional plate flexures; and
a mirrored surface connected to the freely movable plate.

41. The mirror of claim 40, wherein the support structure comprises a support frame held over the reference surface by a plurality of standoff posts.

42. The mirror of claim 40, wherein the support structure comprises a plurality of standoff post pairs, and wherein each actuator is suspended over the reference surface by a respective pair of standoff posts.

43. The mirror of claim 40, further comprising addressing circuitry to selectively apply power to selected ones of the plurality of actuation means to selectively actuate respective ones of the plurality of actuators.

44. The mirror of claim 43, wherein the microelectromechanical mirror is controllably moved in a selected direction by selectively actuating selected ones of the plurality of actuators.

45. The mirror of claim 44, wherein the microelectromechanical mirror is controllably moved in a vertical direction toward or away from the reference surface.

46. The mirror of claim 44, wherein the microelectromechanical mirror is controllably rotated about an arbitrary angle of rotation.

47. The mirror of claim 43, wherein the plurality of actuators are from among the group comprising electrostatic, electromagnetic, piezoelectric, and thermal actuators.

48. The mirror of claim 47, wherein the actuation means for respectively actuating the plurality of actuators are respectively from among the group comprising electrostatic, electromagnetic, piezoelectric, and thermal actuation means.

49. The mirror of claim 48, wherein the plurality of actuation means for respectively actuating the plurality of actuators comprise means for respectively rotating the plurality of actuators.

50. The mirror of claim 49, wherein the plurality of actuators are configured to rotate and are flexibly suspended from the reference surface by a respective plurality of torsional flexures.

51. The mirror of claim 48, wherein the plurality of actuation means for respectively actuating the plurality of actuators comprise means for respectively translating the plurality of actuators.

52. The mirror of claim 51, wherein the plurality of actuators are configured to be translated and are flexibly suspended from the reference surface by a respective plurality of bendable flexures.

53. A microelectromechanical mirror array, comprising a plurality of microelectromechanical mirrors wherein each mirror comprises:
 a reference surface having a plurality of control electrodes;
 a support frame held above the reference surface by a plurality of standoff posts;
 a plurality of electrostatic actuators flexibly suspended from the support frame and respectively held over the plurality of control electrodes;
 a freely movable plate flexibly suspended from the plurality of electrostatic actuators and held above the reference surface; and
 a mirrored surface connected to the freely movable plate.

54. The mirror array of claim 53, wherein the mirrored surface of each mirror in the array comprises a highly polished metal.

55. The mirror array of claim 53, further comprising a mirror support post coupled between the freely movable plate and the mirrored surface of each mirror in the array.

56. The mirror array of claim 53, wherein each electrostatic actuator in each mirror in the array is suspended from the mirror's support frame by a pair of torsional flexures that define an axis of rotation about which the electrostatic actuator is rotatable toward its control electrode.

57. The mirror array of claim 53, wherein the freely movable plate of each mirror in the array is flexibly suspended from the mirror's plurality of electrostatic actuators by a respective plurality of torsional flexures.

58. The mirror array of claim 56, further comprising addressing circuitry to selectively apply voltages to selected ones of the plurality of control electrodes of selected mirrors in the array to selectively rotate respective ones of the plurality of electrostatic actuators of selected mirrors in the array toward their control electrodes.

59. The mirror array of claim 58, wherein each electrostatic actuator of each mirror in the array is held above a respective pair of control electrodes having first and second members and wherein each electrostatic actuator is rotatable in first and second directions toward the respective first and second members of the pair of control electrodes.

60. The mirror array of claim 59, wherein each torsional flexure connecting an electrostatic actuator to a movable plate in each mirror in the array is configured to flexibly pull the plate away from the reference surface and toward the electrostatic actuator when the actuator is rotated in the first direction, and to flexibly pull the plate toward the reference surface and toward the electrostatic actuator when the actuator is rotated in the second direction.

61. The mirror array of claim 59, wherein each mirror in the array is configured to selectively rotate by an arbitrary angle in an arbitrary angular direction when selected voltages are applied to selected ones of the mirror's plurality of control electrodes.

62. The mirror array of claim 59, wherein the plurality of electrostatic actuators can be rotated to critical angles that are proportional to critical forces, further comprising extending the critical force that can be applied to a selected one of the electrostatic actuators of a mirror in the array by selectively rotating selected others of the plurality of electrostatic actuators of the mirror in the array.

63. The mirror array of claim 59, wherein the plurality of electrostatic actuators of a mirror in the array are rotated by a first angle, and wherein the mirror is configured to be rotated by a second angle that is a magnification of the first angle.

64. A microelectromechanical mirror array, comprising a plurality of microelectromechanical mirrors wherein each mirror comprises:
 a plurality of actuators flexibly suspended over a reference surface from a support structure;
 a plurality of actuation means for respectively actuating the plurality of actuators;
 a freely movable plate flexibly suspended from the plurality of actuators by a plurality of torsional plate flexures; and
 a mirrored surface connected to the freely movable plate.

65. The mirror array of claim 64, wherein the support structure for each mirror in the array comprises a support frame held over the reference surface by a plurality of standoff posts.

66. The mirror array of claim 64, wherein the support structure for each mirror in the array comprises a plurality of standoff post pairs and each actuator of each mirror in the array is suspended over the reference surface by a pair of standoff posts.

67. The mirror array of claim 64, further comprising addressing circuitry to selectively apply power to selected ones of the plurality of actuation means of selected mirrors to selectively actuate respective ones of the selected mirror's plurality of actuators.

68. The mirror array of claim 67, wherein a mirror in the array is controllably moved in a selected direction by selectively actuating selected ones of the mirror's plurality of actuators.

69. The mirror array of claim 68, wherein a mirror in the array is controllably moved in a vertical direction toward or away from the reference surface.

70. The mirror array of claim 68, wherein a mirror in the array is controllably rotated about an arbitrary angle of rotation.

71. The mirror array of claim 67, wherein for each mirror in the array the plurality of actuators are from among the group comprising electrostatic, electromagnetic, piezoelectric, and thermal actuators.

72. The mirror array of claim 71, wherein for each mirror in the array the actuation means for respectively actuating the plurality of actuators are respectively from among the group comprising electrostatic, electromagnetic, piezoelectric, and thermal actuation means.

73. The mirror array of claim 72, wherein for each mirror in the array the plurality of actuation means for respectively actuating the plurality of actuators comprise means for respectively rotating the plurality of actuators.

74. The mirror array of claim 73, wherein for each mirror in the array the plurality of actuators are configured to rotate and are flexibly suspended from the reference surface by a respective plurality of torsional flexures.

75. The mirror array of claim 72, wherein for each mirror in the array the plurality of actuation means for respectively actuating the plurality of actuators comprise means for respectively translating the plurality of actuators.

76. The mirror array of claim 75, wherein for each mirror in the array the plurality of actuators are configured to be translated and are flexibly suspended from the reference surface by a respective plurality of bendable flexures.

* * * * *